United States Patent
Noren et al.

[45] Mar. 18, 1980

[54] APPARATUS FOR REGISTERING QUANTITY VALUES OF CORRESPONDING VOLUME OR ENERGY QUANTITIES BY MEANS OF COUNTERS IN A CENTRAL STATION

[75] Inventors: Kjell S. Norén, Stockholm; Stig I. Karlsson, Karlskrona, both of Sweden

[73] Assignee: AB Svensk Varmematning SVM, Bromma, Sweden

[21] Appl. No.: 819,439

[22] Filed: Jul. 27, 1977

[30] Foreign Application Priority Data

Jul. 30, 1976 [SE] Sweden ............... 7608653

[51] Int. Cl.$^2$ .............. G08C 15/06; G08C 19/16; G08C 25/00; H04Q 9/00
[52] U.S. Cl. .................. 340/183; 340/151; 340/181; 340/203; 340/584
[58] Field of Search ........... 340/177 R, 188 R, 183, 340/203, 151, 152 R, 150, 181, 584, 501

[56] References Cited

U.S. PATENT DOCUMENTS

| | | | |
|---|---|---|---|
| 3,806,904 | 4/1974 | Weinberger et al. | 340/188 R |
| 3,820,073 | 6/1974 | Vercellotti et al. | 340/151 |
| 3,961,317 | 6/1976 | De Brem et al. | 340/183 |
| 4,004,097 | 1/1977 | Spaulding | 340/188 R |

*Primary Examiner*—John W. Caldwell, Sr.
*Assistant Examiner*—James J. Groody
*Attorney, Agent, or Firm*—Sughrue, Rothwell, Mion, Zinn and Macpeak

[57] ABSTRACT

Apparatus for registering quantity values of corresponding volume or energy quantitites measured at consumption points at a distance from a central station which has a number of counters corresponding to the various consumption points. Each time a predetermined volume or energy quantity has been measured, the corresponding signal transmitter is activated. A signal is then relayed from the transmitter back to the central station where it is initially stored in a shift register device having a length equal to the number of transmitters coupled to the central station. Each of the transmitters is coupled to a distributing device which selectively samples and couples each of the transmitters to the central station as they are activated. Output signals from the shift register device emerge therefrom in synchronism with a subsequent activation of the transmitter to which they correspond. The output signals are then coupled through a switch device to the corresponding counters.

9 Claims, 5 Drawing Figures

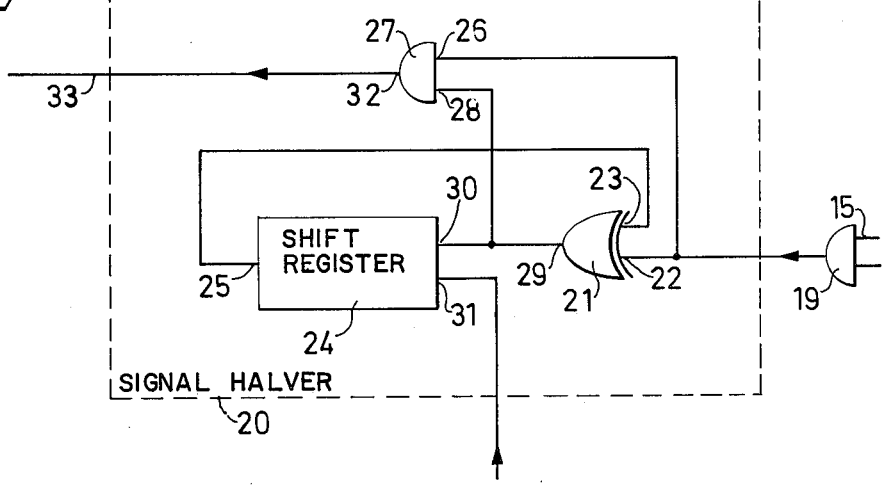
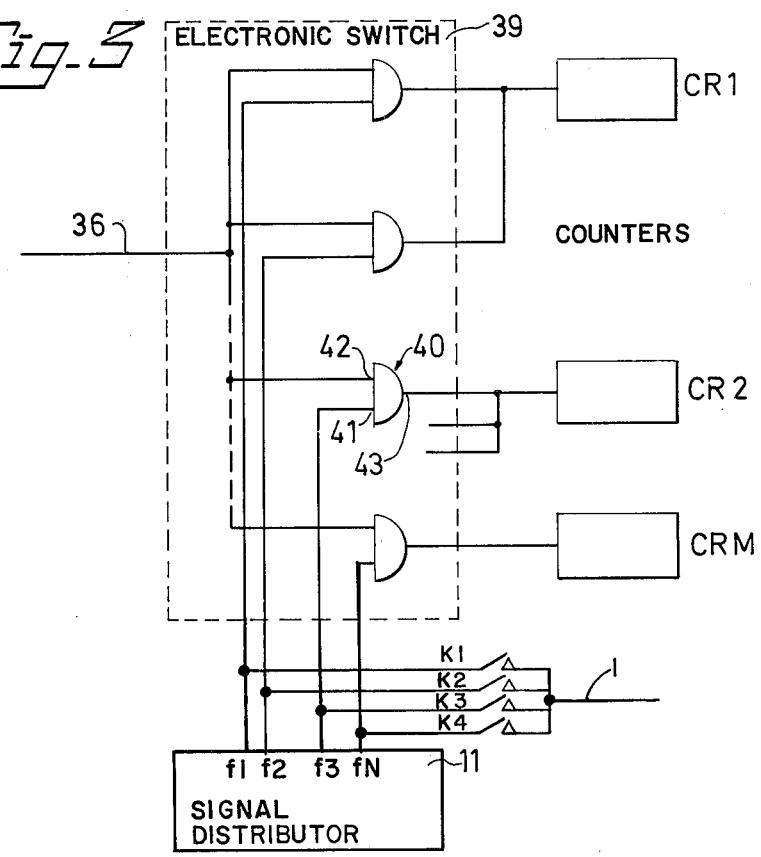

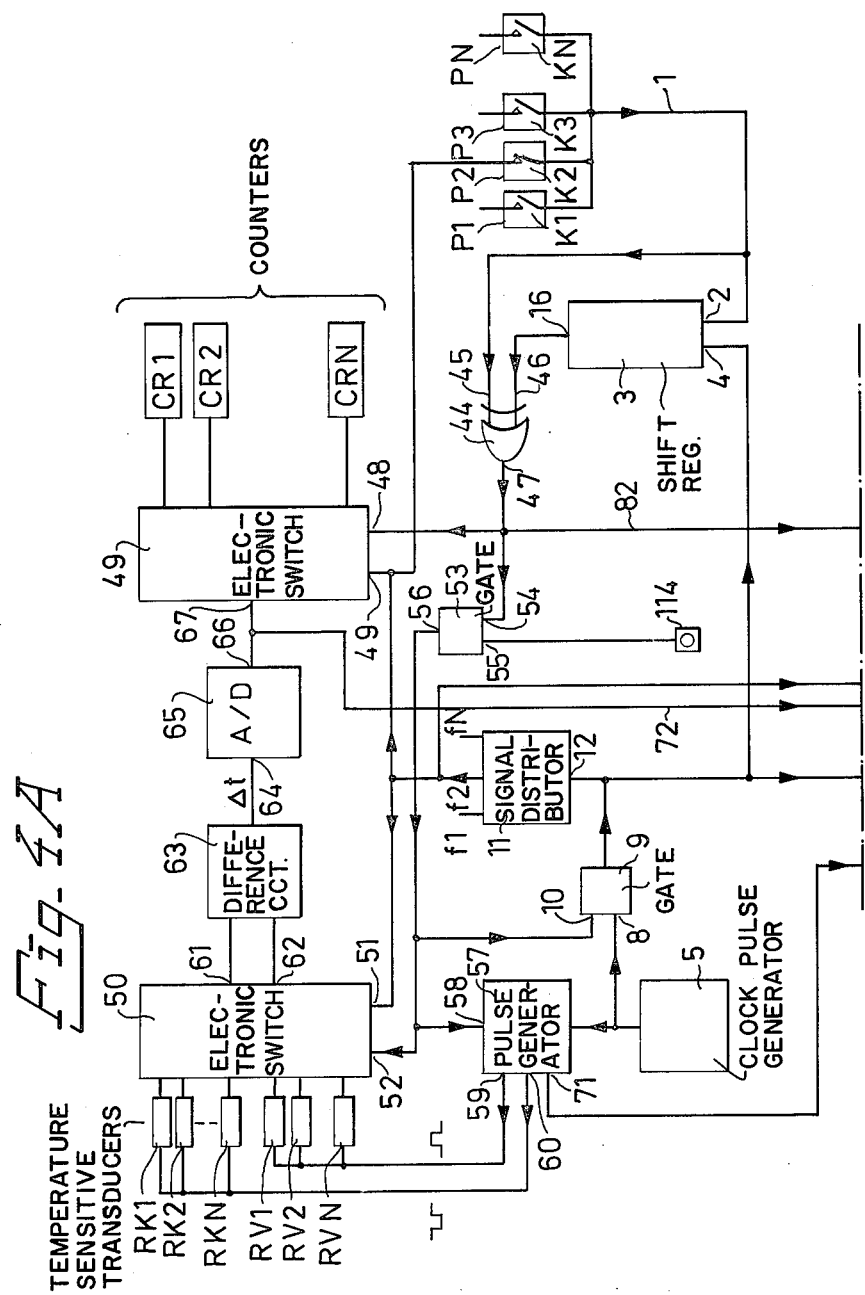

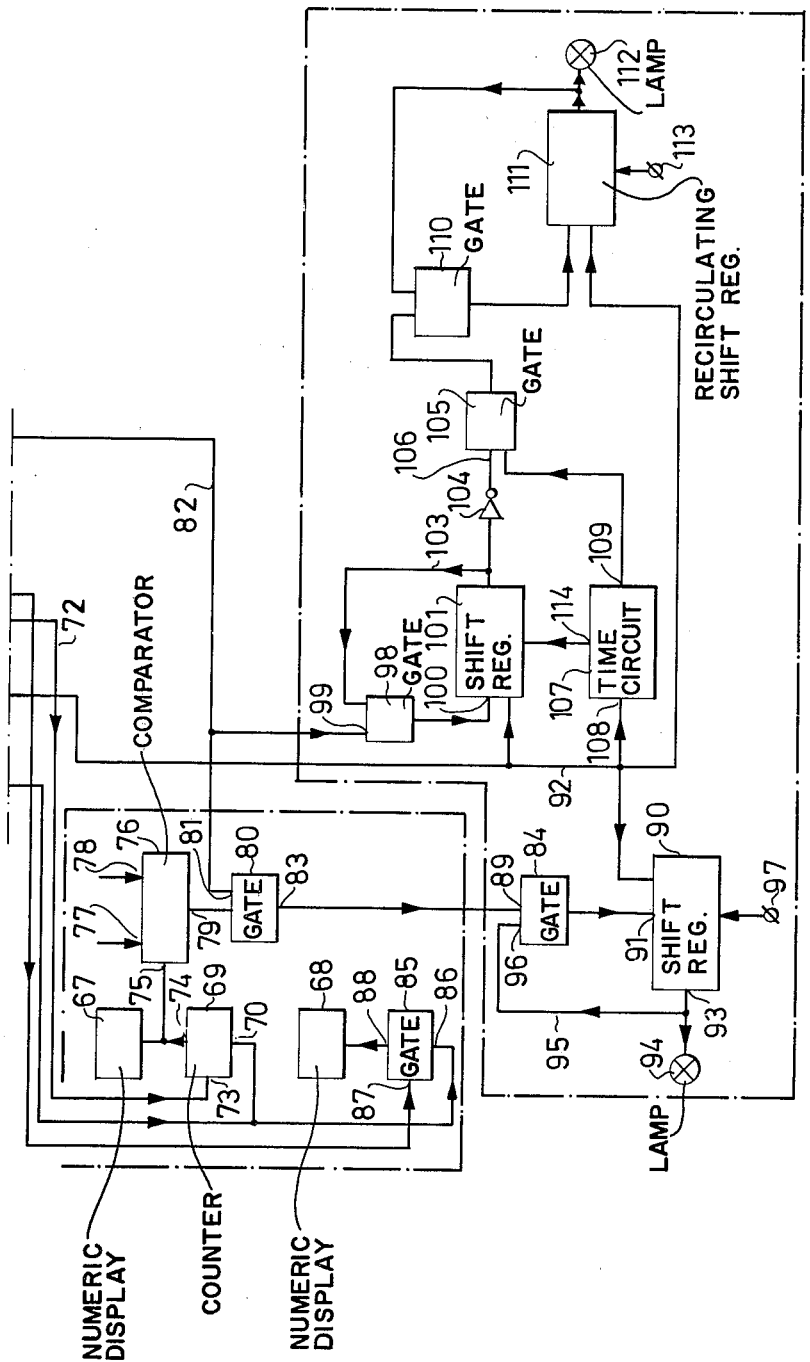

APPARATUS FOR REGISTERING QUANTITY VALUES OF CORRESPONDING VOLUME OR ENERGY QUANTITIES BY MEANS OF COUNTERS IN A CENTRAL STATION

BACKGROUND OF THE INVENTION

Quantity measuring devices of the type stated, e.g. for measuring cold water consumption, hot water consumption, gas consumption or electrical energy in an apartment or house, are being used to an increasing extent. The reason for this is, inter alia, the ever-increasing costs for personnel needed to read the meters at each consumption point.

In installations having centralized reading, installed up to now, each counter has been directly connected to an associated meter. In many cases the same consumer has furthermore several quantity meters, the consumption measurements of which are to be registered on a single counter, it therefore being necessary to arrange special memory or delaying circuits for such meters in order to prevent incorrect registration in the cases were two meters transmit measurement signals simultaneously. The requirement of allocating the costs for the totally consumed quantity to the individual consumers in the form of the quotient between the individual consumption and total consumption is present in many cases, and for this reason a total consumption counter is desired in the installation. Memory circuits or delaying circuits between the individual counters and the total consumption counter are required for the total consumption counter to register correctly, which means that the installation will be made more complicated and expensive. The object of the invention is to provide an apparatus which completely eliminates the problems mentioned above.

SUMMARY OF THE INVENTION

This object is substantially realized in that the apparatus described in the introduction is characterized by a distributing device stepwise controlled by clockpulses from a clockpulse generator, the device having a working revolution time equal to or less than the time each signal transmitter is in an active state, and arranged for connection to the signal transmitters in turn, so that when a signal transmitter in the active state is acquired, it gives an order signal to a memory device, arranged to store the order signal on receiving it and to transmit a memory signal, corresponding to the state of the activated signal transmitter when it was last acquired by the distributing device; by a gate circuit means, arranged partly to receive the order signal from the acquired signal transmitter, and partly to receive the memory signal transmitted by the memory device, and that if both signals indicate that the signal transmitter was in an unactivated state at said preceding connection, to generate a start signal to a measurement pulse generator for transmitting a measurement signal, and a stop signal to the distributing device to retain it in its set position corresponding to the address of the activated signal transmitter; and by a switching means arranged to connect, in response to an address signal from the distributing device corresponding to the set position of the distributing device, the counter associated with the activated signal transmitter for receiving said measurement signal from the measurement pulse generator.

The wiring between the quantity meter and the counters will be simplified by an apparatus of this kind, the number of circuits will be small since the risk of simultaneously occurring measurement signals is prevented and operational reliability will thereby be large.

The invention will now be described below by means of two embodiments selected as examples. On the appended drawings,

BRIEF DESCRIPTION OF THE DRAWINGS

FIG. 2 shows a circuit in the apparatus according to FIG. 1, for halving the measurement signal, FIG. 3 shows an example of a switch for the apparatus according to FIG. 1 and FIGS. 4A and 4B together show an apparatus according to the invention for measuring heat energy.

DETAILED DESCRIPTION OF THE PREFERRED EMBODIMENTS

Figure 1:
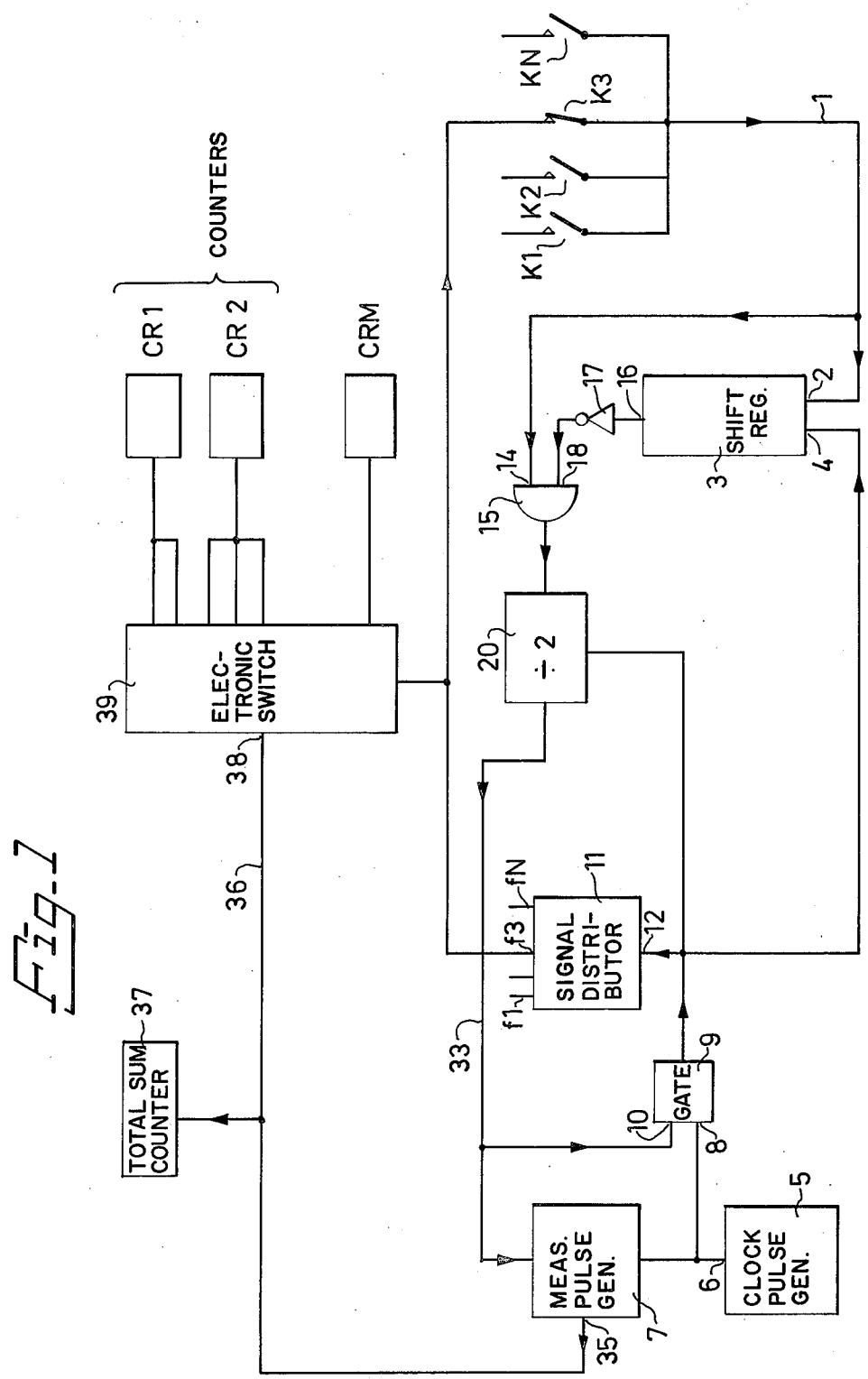
FIG. 1 shows, simplified, an apparatus according to the invention for registering cold water consumption.

FIG. 1 shows, simplified, an apparatus for registering signals from individual meters, e.g. water meters, transmitting a measurement signal after the passage of a specified quantity of water, or electricity meters giving a measurement signal after the consumption of a specified quantity of energy. These measurement signals from the different volume or energy meters which are generally to be found in different places in a house or a dwelling area, are then fed to remote counters at a central reading station.

In the following, FIG. 1 is assumed to show an apparatus for registering consumed water quantity. Each water consumer, i.e. an apartment or a house, or in certain cases a house with a plurality of apartments, is equipped with a water meter (not shown) of the conventional kind transmitting a measuring signal, as soon as a certain quantity of water has flowed through the meter.

The signal transmitting means in each meter is illustrated in FIG. 1 in the shape of a contact K1, K2, K3 ... KN, which is closed when said specified water quantity has passed through the meter. In the present case, it is further assumed that the means providing contact comprises a rotating magnet actuating a reed relay to provide two signals per measuring occasion. Thus, if the meter which is allocated the contact K3 has measured the specified amount of water, the contact K3 is closed twice and two signals which can be regarded as binary "1's" are transmitted on the wire 1, common to all contacts K1-KN, to the input 2 on a shift register 3. The shift register 3 is stepped by means of clock signals on an input 4 from a clockpulse generator 5. The clockpulse generator 5 continuously transmits clockpulses from the output 6 to a measurement pulse generator 7 and to the input 8 on a gate 9 which is latched if a signal occurs on the input 10 simultaneously with the clockpulse. A signal distributor 11, with a number of outputs f1-fN corresponding to the number of contacts K1-KN, receives on an input 12 the clockpulses passing through the gate 9, thereby being stepped forward to a new address, corresponding to the water meter contact to be sensed. In FIG. 1, the distributor is assumed to be in the position for sensing the contact K3 which has been closed. It is further assumed that on the nearest previous arrival of the distributor to this position the contact K3 was open, i.e. the specified measuring quantity had not been attained.

With the distributor in position f3 and K3 closed, a pulse is sent from the distributor through K3 over the wire 1, and thereby a binary "1" appears on the input 2 of the shift register 3 and on the input 14 on an AND-circuit 15. The shift register 3 is so arranged that it is one revolution behind the distributor 11, i.e. the output 16 will have the signal corresponding to the position of the contact K3 during the nearest preceding revolution after the shift register 3 has been stepped forward by means of the clockpulse on the input 1. Since K3 has been assumed open during this preceding revolution, the output 16 will be at low level and thus generate a binary "0". The output signal from the output 16 is sent through a negator 17 to the other input 18 of the gate 15, and this input thus receives a binary "1", similarly to the input 14. In this case, it has furthermore been assumed that each contact gives a signal twice, and that both the binary "1's" are transmitted from the AND-circuit output. So that double quantities of water will not be registered, the output signals are fed from the gate 15 to a signal halver 20, which only allows alternate binary "1's" through.

This signal halver is shown in detail in FIG. 2. The signal halver 20 contains an exclusive OR-gate 21 with a first input 22, to which are applied signals from the output 19 of the gate 15, and a second input 23, to which are applied the output signals from the output 25 of a shift register 24. One input 26 on an AND-gate 27 is further applied to the output 19 on the AND-gate 15. The second input 28 of the AND-gate 27 is connected to the output 29 on the gate 21, and this output 29 is connected to one input 30 of the shift register 24. The other input 31 of the shift register is connected to the output on the gate 9 (FIG. 1). The output 32 of the AND-gate 27 is connected to the wire 33 in FIG. 1.

When sensing a certain contact, there will be a "1" or "0" on the output 19, coming from the AND-gate 15. In most cases it will be a "0", but if a contact closure has taken place after the preceding scan, it will be, as described above in conjunction with the contact K3, a binary "1". The intention with the halving circuit 20 is, as mentioned, that only alternate "1" shall reach the output 32 on the AND-gate 27.

Assume that on the output of the shift register 24 there is a "1" when the scans, given in the table below, are begun for a certain contact, e.g. the contact K3. It should be noted that the signal, occurring on the output 29 from the gate 21 for a certain scan, is moved to the output 25 on the next scan of the shift register 24.

Signal on

| 22 | 25 | 30 | 32 |
|----|----|----|----|
| 0  | 1  | 1  | 0  |
| 0  | 1  | 1  | 0  |
| 1  | 1  | 0  | 0  |
| 0  | 0  | 0  | 0  |
| 0  | 0  | 0  | 0  |
| 1  | 0  | 1  | 1  |
| 0  | 1  | 1  | 0  |
| 0  | 1  | 1  | 0  |
| 1  | 1  | 0  | 0  |
| 0  | 0  | 0  | 0  |
| 0  | 0  | 0  | 0  |
| 1  | 0  | 1  | 1  |

It is apparent from the above table that the signal halver only allows alternate "1's" through to the output 32, and that complete consideration is thereby taken to there being two contact closures for each measurement revolution of the water meter in the example dealt with. In the cases where there is only one contact closure per measurement revolution, there is naturally no need for any signal halving, and furthermore it is possible to use any other type of circuit which provides the necessary halving of the signals required in the example taken.

If a binary "1" appears on the output 32 from the signal halver 20, it is sent over the wire 33 to the input 10 on the gate 9, thereby blocking this gate so that clockpulses can not reach the distributor 11 and the shift register 3, to alter their settings. The signal on the wire 33 is also sent to the input 34 on the measurement pulse generator 7, which thereby generates a measurement pulse on the output 35. The measurement pulse is sent over a wire 36 to the input on a total sum counter 37. The counter 37 will thus count the sum of all measurement pulses and indicate the total consumption of all the meters connected to the system. The measurement pulse from the measurement pulse generator 7 is also sent to a measurement input 38 on an electronic switch 39, and through the switch 39 to the counter CR1, CR2 ... CRM, which is allocated to the contact K1-KN, which by its closure started a registration cycle. As is indicated on FIG. 3, the counter CR1 is allocated two contacts, e.g. contact K1 and K2, the counter CR2 is allocated three contacts, e.g. contacts K3, K4 and K5 and the counter CRM is allocated a single contact e.g. contact KN. The reason why a plurality of consumption points can be allocated a single counter is that one and the same consumer is to be debited, and there is no reason for debiting the consumer for each separate consumption point.

The switch 39, the function of which is to transfer the measuring pulse coming in on the input to the right counter, has its switching position determined by the contact address in the stationary distributor 11.

An example of such a switch 39 is shown in FIG. 3. For each contact position in the distributor 11, the switch 39 contains an AND-gate, e.g. the AND-gate 40 for the contact position f3. Each gate has one input, e.g. the input 41 on the AND-gate 40, connected to the corresponding contact position of the distributor and the address to the counter which is to receive the measurement signal on the wire 36 is thereby determined. The gate is opened by its second input, e.g. the input 42 on the gate 40, being given the measurement signal. In the case related above, the distributor has stopped in the position f3, corresponding to the contact K3, and the measurement pulse generator 35 has sent a measurement pulse. Both the inputs 41 and 42 thus receive opening signals and the gate 40 sends a signal on the output 43 to the counter CR2 which, as previously mentioned, is common for the water quantity meters having the contacts K3, K4 and K5. CR2 thus registers a unit quantity which is added to the previous result on CR2.

The measurement pulse generator 7, which is synchronized with the clockpulse generator 5, transmits a measurement pulse of such length that it is safely registered by the appropriate counter CR1 ... CRM and, if there is one, by the total sum counter 37. As soon as the measurement pulse has ceased, e.g. after 10 ms, the stop pulse also ceases on the input 10 of the gate 9, and the clockpulses are allowed through to step the distributor 11.

The distributor can be of any suitable mechanical or electronic kind, and its sole task is to sense the different contacts K1-KN or other signal transmitters in use, and to stop when a signal is discovered, to give the right address to a counter, and it can have a revolution time of, for example, 10 seconds, signifying that the signal from a contact K1–KN must be just as long so that no signal will be lost. As a rule, the signal time from a contact or signal transmitter K1–KN is considerably longer and can cover several revolutions of the distributor or sensor 11. When the distributor returns to an already sensed closed contact, e.g. the contact K3, a measurement cycle may not therefore be started. The memory or shift register 3 will therefore, on receipt of the new "1" from the contact, feed out the nearest preceding stored information, i.e. "1", and after negating in the negator 17 a "0" is thus fed to the input 18 on the gate 15. The gate will thus remain closed. If shorter signals are used, a buffer memory must be arranged between the contacts K1–KN and the distributor.

It is apparent from the above that the central unit, comprising all the components with the exception of the contacts themselves, is very simple and results in the least possible amount of wiring between the consumption points and the central station, and that only one consumption point at a time can cause a measurement signal. The latter results in that, inter alia, the total consumption meter 37 can be coupled directly to the wire from the measurement pulse generator 7. By using a total consumption meter, it is easy to form the quotient between individual consumption and total consumption for debiting purposes.

It has been assumed above that the command signal, sent by the distributor 11 to the shift register 3 on acquiring an activated signal transmitter K1–KN, is identical with the opening signal sent to the switch 39 from the distributor. It is however possible to arrange the distributor so that a special address signal is transmitted simultaneously with or somewhat later than the command signal, this address signal giving the position of the distributor, i.e. the address to the activated signal transmitter.

The FIGS. 4A and 4B together show a means for registering at a central station the heat energy which is supplied to each of a plurality of consumption points for room heating by means of a flowing, heated medium, e.g. hot water, each consumption point being allocated a meter through which the hot water flows, and which is so arranged that when a definite quantity of hot water has been supplied to the consumption point, a quantity signal is transmitted which is registered on an associated counter. Here, each consumption point is further equipped with two temperature-sensitive tranducers, e.g. temperature-sensitive resistances or thermistors, arranged for actuation by the temperature of the hot water flowing to the consumption point and the temperature of the cooled water departing from the consumption point, respectively. In the FIGS. 4A and 4B, elements and circuits having correspondence in the previously described apparatus have been given the same reference characters as previously.

In FIG. 4A, P1 denotes a first quantity meter of rotating type for measuring the quantity of heating medium, here assumed to be hot water, which is supplied to a space, e.g. an apartment in an apartment building, which is to be heated. P2–Pn are other such quantity meters for other apartments. Each quantity meter P1–PN is, as is previously described, provided with a contact, e.g. the contact K3 for the meter P3, which is closed after a certain amount of hot water has passed the meter and has been taken through radiators, for example, in the apartment in which the meter is installed. The contact K2 is shown in the closed position in FIG. 4A, i.e. a registration shall take place on the associated counter CR2 in the central station. In the following, the course of events is therefore described with reference to the contact K2. As has been described above in conjunction with the FIGS. 1–3, the distributor 11 stops when it acquires the activated contact K2, but counter to what has previously been assumed here, it is now assumed that only one signal is sent over K2 from the distributor 11. This signal is received on input 2 of the shift register 3 for storage, and a stepping signal has been received on input 4 of the shift register, from the clockpulse generator 5 via the open gate 9, whereby there is a signal on the output of the shift register 3 denoting the state of the contact K2 at the nearest preceding scan by the distributor 11. It is assumed that at this previous scan the contact P2 was unactivated, i.e. open, and therefore the signal on the output 16 from the shift register 3 is a binary "0". An exclusive OR-circuit 44 receives the binary "1" from the contact P2 on its input 45, and on its second input 46 the binary "0" from the shift register 3, and opens to send a signal on its output 47. This signal is transmitted to an "execute"-input 48 on the switch 49. The switch, arranged substantially in the same way as the switch 39 according to the FIGS. 1–3, has also an address signal on its input 49. This address signal is obtained from the distributor 11. The address is thus determined by one of the wires f1–fN from the distributor 11, and in this case by the wire f2. The switch is thus in a position for transferring a measurement signal to the counter CR2. The switch 50, having substantially the same construction as the switch 49, has an address input 51 and an "execute"-input 52, which receives signals from the distributor 11 and from a gate circuit 53, respectively. The gate circuit 53 has an input 54 to open the circuit by means of signals from the gate circuit 44, and an input 55 to open the circuit by means of a control signal, which will be described later. The signal from the gate circuit 44 is thus taken through the opened gate 53 to the input 52 of the switch 50 and the switch is set to the intended address position and is ready for passing measurement signals. From the output 56 of the gate 53 there is also transmission to the input 10 of the gate 9, and the gate therefore does not pass clockpulses from the clockpulse generator 5 to the input 12 of the distributor 11. The distributor 11 thus stops in the address position corresponding to the contact K2.

The pulse generator 57 receives a start signal on its input 58 from the gate 53 and the clockpulse from the clockpulse generator 5, and in appropriate cases transmits from its output 59 a square pulse, and on its output 60 a 180° phase-shifted square pulse.

Temperature-sensitive transducers RK1–RKN and RV1–RVN, respectively, are connected to the inputs of the switch 50. The transducers RK1–RKN sense the temperature of the departing cooled water from the respective associated apartment, and the temperature-sensitive transducers RV1–RVN sense the temperature on the incoming hot water to the respective apartment. In the example assumed here, the contact K2 has been activated and therefore the corresponding transducers RK2 and RV2 have been connected by the switch 50 to the respective outgoing wire 61 and 62. Measurement pulses from the pulse generator 57 are thus sent through the transducer RK2 and RV2, respectively, and since the resistance of these is here assumed to depend on the temperature, the output signals obtained on the output 61 and 62, respectively of the switch 50 will constitute a direct measure of the heat energy in the quantity of water fed to the apartment, and the remaining heat energy of the quantity of water departing from the apartment. Both signals from the switch 50 constitute temperature signals ti and tu, respectively, where ti denotes the temperature of the incoming water and tu the temperature of the departing water. Both signals are fed to a different circuit 63, forming the difference signal $\Delta t$, which is proportional to the difference between ti and tu and is a measure of the energy taken in the apartment from the specified quantity of water.

The difference signal $\Delta t$ is fed to the input 64 on a quanitizer 65, to generate on its output 66 a pulse train corresponding to $\Delta t$, which is taken to the input 67 on the set switch 49, which sends the pulse train to the selected counter, in this case CR2, the energy quantity represented by the pulse train from the quantitizer 65 being added to the previous result on the counter CR2.

After the pulse from the output 56 of the gate 53 has ceased, approximately simultaneously with the measurement pulse, the latch on the gate 9 is released and the distributor is stepped to the subsequent address contact position and transmits a pulse through the contact P3 if the contact is closed, whereby, if the output from the shift register 3 indicates that P3 was open at a preceding scan, the described registration cycle is repeated for registering an energy quantity on the associated meter (not shown).

A check portion and an alarm portion, shown in FIG. 4B are connected to the measurement and registration portion proper in FIG. 4A.

The check portion contains a first numerical display 67 and a second numerical display 68 to show $\Delta t$ from the respective measuring point at each measurement. The apparatus is such that on measuring, the temperature difference and the actual address, i.e. the meter, is shown on the respective display, and the indication remains until the next time when the distributor acquires an address where measurement is to take place.

On the input 70, a counter 69 receives a pulse from the output 71 of the pulse generator 57 and is thereby zeroed. The pulse from the measurement pulse generator on the output 59 or 60 can possibly be used for zeroing the counter 69, which can be of any suitable known type. When the negator 65 generates the said pulse train, it is sent not only to the switch 49 but also to the input 73 of the counter 69 via a wire 72, and the number of received pulses are counted and the counter 69 gives the new $\Delta t$-value within, for example, 10 ms.

The output 74 of the counter 69 is connected to the numerical display 67, visually indicating the value of $\Delta t$. The output 74 is furthermore connected to an input 75 on a comparator 76. A signal is fed to the command input 77 on the comparator, denoting a lower assumed value for $\Delta t$ and a reference signal denoting an upper assumed value for $\Delta t$ is fed to a third input 78. The difference between said assumed upper and lower values of $\Delta t$ is formed in the comparator and compared with the value of $\Delta t$ applied to the input. If a notable difference is obtained, a fault signal is generated on the output 79 of the comparator 76. Since the comparator will obtain at each measuring occasion the $\Delta t$ value 0 from the counter 74, the output signal from the comparator is delayed some ms so that the counter has time to count the $\Delta t$ value prevailing at the time of measurement. Since in the present case the counter 69 further remains at the value which caused the fault signal, up to the next measuring occasion, the fault signal must be transmitted over a momentarily open gate circuit 80. The gate circuit 80 receives the signal from the gate 44 via a wire 82 on its input 81. The fault signal is therefore transmitted from the output 83 of the gate circuit 80 only as long as the signal occurs on the wire 82, e.g. for 10–20 ms. The fault signal is transmitted to and received by a gate circuit 84 in the alarm portion, as will be described later.

The signal display 68 is connected to a latch type gate 85, which may be likened to a conventional gate with a memory function. One input 86 of the gate 85 receives signals from the output 71 of the measurement pulse generator 57 and the other input 87 of the gate is given the applicable address signal from the output 12 of the distributor 11. The information fed to the address input 87 is retained on the output 88 of the gate 85 even after the address signal from the distributor has ceased and the signal display 68 will thereby show the address until new address information has been fed in.

As is stated above, the fault signal is sent to the OR-gate 84. The fault signal is received by the gate 84 on its input 89 and is sent via this gate to one input 91 of a shift register 90, with the distributor 11 in its set position on the address 2. The fault signal is thereafter clocked or stepped through the N positions of the shift register by means of the clockpulses on the wire 92, and after one distributor revolution the fault signal comes on to the output 93 of the shift register 90 and the warning lamp 94 illuminates. The fault signal is simultaneously fed via the wire 95 to the input 96 of the gate 84 and is returned to the data input 91 on the shift register 90. The warning lamp will thus light up each time the distributor reaches the applicable address and indicates that the temperature difference $\Delta t$ is or has been abnormal, which can be caused, for example, by the temperature-sensitive transducer RK or RV at the address being faulty. Fault indication continues until the shift register 90 is reset by means of a zeroing signal on the input 97.

The warning or alarm signal portion furthermore has circuits for monitoring the contacts K1–KN.

These circuits are shown to the right of the alarm portion on FIG. 4B, already described. An OR-gate 98 receives on one input 99 the execute signal on the wire 82 and sends an output signal to the input 100 on a shift register 101. The received signal is stepped through the shift register by means of the clockpulses on the wire 92 and via a loop 103 it will pass through the N positions of the shift register. As further contacts K1–KN are activated, the corresponding number of binary "1's" will pass round in the shift registration. The output signal from the shift register 101 is transmitted to a negator 104, and the address, which has not yet had contact change is thus indicated as "1" for the AND-gate 105, one input of which is supplied with the signals from the negator 104. A time circuit 107 is controlled by clock signals fed to the input 108, and when a certain number of clock signals, corresponding to a time period of 10 minutes, for example, have been obtained, the time circuit sends an opening signal from the output 109 to the gate 105.

The shift register 101 continuously transmits information signals, and stored "0's" are changed by the negator 104 to "1's", which are passed out through the gate 105 to a gate 110. The time circuit 107 sends its opening signal during N clockpulses and the whole content of "0's" in the shift register 101 can thus go through the gate 110 after inversion. Addresses with contacts unactivated during the 10 minute period are thus passed through the gate 110 to a recirculating shift register 111 of the same type as the shift register 90. Each time an output signal is transmitted from the shift register a warning lamp 112 is illuminated. The register is emptied by applying a zeroing signal to the input 113. The time circuit 107 is further arranged to send a zeroing signal from the output 114, after the shift register 101 has received the N clockpulses, to the shift register 101 for zeroing this register. It will therefore be appreciated that each contact K1–KN which has not altered its state during the 10-minute monitoring period of the time circuit 107 will have its address stored.

The check and alarm portion of the system thus enables the observation at any time of occurring faults and addresses to incorrect places on both the numerical displays 67 and 68 and the lamps 94 and 112. In certain cases it can be suitable and necessary to retain fault indications for a longer time than what is possible when the execute signal is obtained from the gate circuit 44. A constant signal to the output 56 on the gate 53 can therefore be provided by means of a manually actuatable signal transmitter 114 (FIG. 4A) on the control panel containing the numerical displays and warning lamps, this signal transmitter feeding a constant execute signal to the input 55 of the gate circuit 53. The false signal activates the measurement pulse generator 57, and this transmits a pulse having a length corresponding to the length of the signal from the circuit 114. By depressing a press button on the signal transmitter 114 one can thus retain the results on the signal displays and the step forward the different addresses at a desired rate. The use of this false execute signal does not however disturb the counters, since the input 48 of the switch 49 does not receive any opening signal. This manual stepping of the distributor 11 sometimes takes place so slowly, however, that it may happen that a certain contact K1–KN has time to be both activated and returned to an inactive state before the distributor has acquired the address of the contact, and thereby a measurement value can be lost. If so required, the warning lamps can be supplemented with or replaced by acoustic warning means. It should be noted that the term "contact" does not only relate to a mechanical contact but to any type of signal transmitter at all, arranged so that when a certain quantity of energy, for example, is measured it provides a quantity signal, i.e. it is transferred from an inactive state to an active state. The active state thus signifies that a contact has been taken from an inactive position in which it is closed or open to an activated position in which a changed contact position is obtained. Examples of signal transmitters which can be used are reed relays, mechanically actuated relay contacts and semi conductor elements.

We claim:

1. Apparatus for registering, by means of counters (CR1–CRN) in a central station, quantity values of corresponding volume or energy quantities measured at consumption points distant from the station, each consumption point being allocated a measuring device with a signal transmitter (K1–KN) arranged so that when said volume or energy quantity is measured the signal transmitter is put into an active state for transmitting a signal to an associated counter, said apparatus being characterized by a distributing device (11) stepwise controlled by clock-pulses from a clock-pulse generator (5), the device having a working revolution time equal to or less than the time each signal transmitter is in an active state, and arranged for connection to the signal transmitters (K1–KN) in turn, so that when a signal transmitter in the active state is acquired, the transmitter produces an order signal to a memory device (3), the order signal ordering the memory to transmit a memory signal which is stored in the memory, the memory device being arranged to store the order signal on receiving it and to transmit a memory signal indicating the state of the memory, the memory signal corresponding to the state of the activated signal transmitter at the time when it was last acquired by the distributing device; by a gate circuit means (15; 44) arranged to receive the order signal from the acquired signal transmitter and the memory signal transmitter by the memory device, and that if the signals indicate that the signal transmitter was in an unactivated state at the previous time that the signal transmitter was acquired by the distributing device and is then in the activated state, to generate a start signal to a measurement pulse generator (7; 57) for transmitting a measurement signal, and a stop signal to the distributing device (11) to retain it in its set position (f1–fN) corresponding to the address of the activated signal transmitter; and by a switching means (39; 49, 50) arranged to connect, in response to an address signal from the distributing device (11) corresponding to the set position of the distributing device, the counter associated with the activated signal transmitter for receiving said measurement signal from the measurement pulse generator (7; 57).

2. Apparatus as claimed in claim 1, characterized in that the memory device consists of a shift register (3) with a number of storage positions corresponding to the number of signal transmitters (K1–KN).

3. Apparatus as claimed in claim 1, in which each signal transmitter (K1–KN) is arranged to transmit two signal pulses for each measurement of said volume or energy quantity, characterized in that a signal halving circuit (20) is arranged after the memory device (3).

4. Apparatus as claimed in claim 1, characterized in that each signal transmitter consists of a relay with a closing contact (K1–KN).

5. Apparatus as claimed in claim 1, characterized in that the measurement pulse generator (7) is connected to a total sum counter (37) arranged to register the sum of measurement pulses transmitted from the measurement pulse generator.

6. Apparatus as claimed in claim 1, characterized in that the switch means (39) is arranged to feed measurement pulses for different addresses to one and the same counter (CR1–CRM).

7. Apparatus as claimed in claim 1, characterized in that temperature sensitive means (RV1, RVN, RK1–RKN) are connected to the output (59, 60) of the measuring pulsegenerator (57) and are arranged to be activated in response to the temperature of the respective consumption point and to change the value of the measurement signal in correspondence with this temperature.

8. Apparatus as claimed in claim 7, characterized in that said temperature-sensitive means comprise first means (RV1–RVN) arranged to be activated by the temperature of a heating medium supplied to the consumption point, and second means (RK1–RKN) arranged to be activated by the temperature of the heating medium departing from the consumption point; and in that there is a difference circuit for forming a difference signal consisting of the difference between the modified measurement signals obtained from said first and second means, said difference signal being applied by the switch means (49) to a counter selected by the switch means.

9. Apparatus as claimed in claim 8, characterized by means (67, 68, 69) arranged to receive the difference signal and said address signal from the distributing device (11) and visually to indicate these signals.

* * * * *